Figure 1:
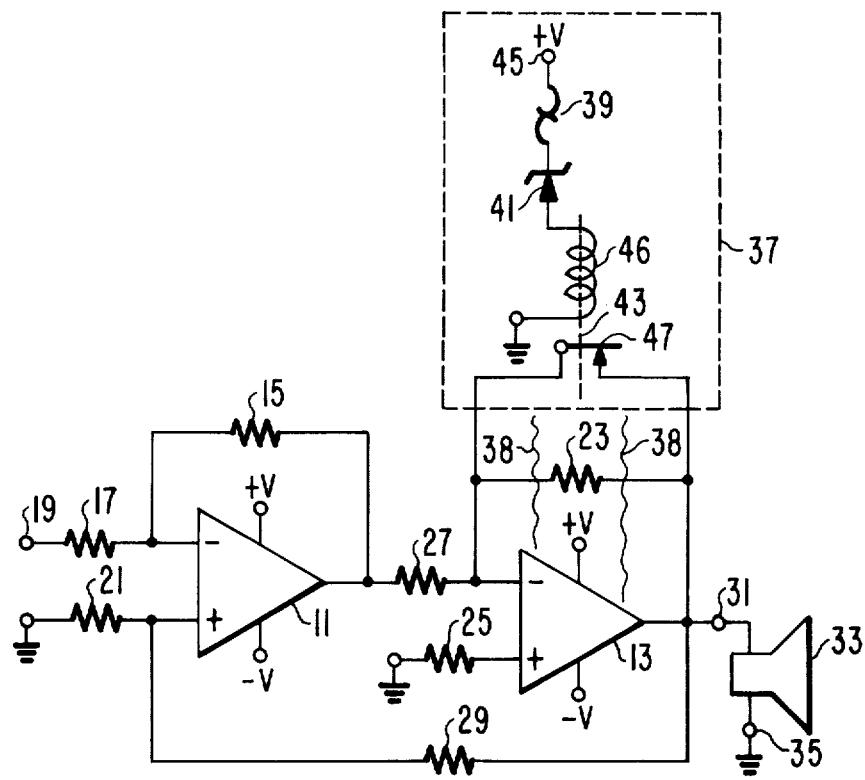

United States Patent [19]

Glogolja et al.

[11] 4,054,845
[45] Oct. 18, 1977

[54] TRANSIENT AND THERMAL PROTECTION

[75] Inventors: Miroslav Glogolja, Hillsborough; Charles Brook Leuthauser, Oldwick, both of N.J.

[73] Assignee: RCA Corporation, New York, N.Y.

[21] Appl. No.: 638,844

[22] Filed: Dec. 8, 1975

[51] Int. Cl.$^2$ ............................................. H03F 21/00
[52] U.S. Cl. ............................... 330/207 P; 330/143; 361/103; 361/105
[58] Field of Search .................... 330/207 P, 110, 143; 325/478, 492; 361/56, 103, 105

[56] References Cited

U.S. PATENT DOCUMENTS

| | | | |
|---|---|---|---|
| 3,480,835 | 11/1969 | Richman | 330/143 X |
| 3,541,457 | 11/1970 | Leighty et al. | 330/207 P X |
| 3,588,729 | 6/1971 | Satterfield | 330/207 P |
| 3,840,820 | 10/1974 | Kawada | 325/478 X |

Primary Examiner—Lawrence J. Dahl
Attorney, Agent, or Firm—H. Christoffersen; Allen LeRoy Limberg; John M. O'Meara

[57] ABSTRACT

A normally-closed temperature sensitive switch which is heat coupled to the output transistors of an amplifier, is connected in series with a zener diode and the operating coil of a relay. When the voltage applied to the series circuit, which is the same voltage as applied to the amplifier, is insufficient to cause breakdown of the zener diode, the relay remains inactivated, and a pair of relay contacts across a feedback resistor of the output transistors remains closed. This keeps the output transistor off so that transients (which are the response of the amplifier to the rapid change in operating voltage when the amplifier is first turned on or when it is turned off) are substantially reduced. When the voltage reaches a given level at or close to the nominal operating voltage level, the relay is activated and the output transistors are turned on. When the temperature reaches a value such that the switch opens, the relay is inactivated and the output transistors are thereby turned off.

16 Claims, 2 Drawing Figures

TRANSIENT AND THERMAL PROTECTION

The present invention relates to protection circuits for amplifiers, and more specifically to circuits for reducing turn-on and turn-off transients and for thermal protection.

Voltage transients often occur in the output signal of an amplifier, when power is applied to or removed from the amplifier. Such transients are especially undesirable in audio amplifiers, where they are manifested as noise thumps which are bothersome and which can cause damage to the loudspeaker. One method of eliminating or substantially reducing turn-on transients is to couple the loudspeaker to the output terminals of the amplifier via the normally open contacts of a time dealy relay, which is energized by the same power source as the amplifier. The relay keeps the speaker disconnected from the amplifier for several seconds, after the amplifier is turned on and by that time the transients in the output signal have subsided. A problem with this method is that the contacts of the relay must be capable of switching the high currents delivered from the amplifier to an inductive load, represented by the loudspeaker. And because of such currents and also because of the arcing which sometimes occurs, the relay contacts sometimes fail. Further, the several seconds delay required for this form of protection is annoying to some users and is undesirable in some applications.

A common method for thermally protecting the output transistors of an amplifier is to connect the normally-closed contacts of a temperature sensitive switch, heat coupled to the transistors, in series with the primary winding of the power transformer of the amplifier. When the temperature of the output transistors exceeds a predetermined level, the normally-closed contacts open and disconnect the power from the amplifier. Because the contacts of the temperature sensitive switch must be capable of disconnecting the power to the primary of the transformer, while the amplifier is being fully driven, this method is generally suitable for use only with low and medium power amplifiers. In circuits embodying the present invention, a low resistance is placed across a feedback element of an amplifier whenever the amplitude of the operating voltage applied to the amplifier is below a predetermined level. In a preferred embodiment of the present invention, the same action is taken whenever the temperature of the output stage exceeds a predetermined value.

Figure 2:
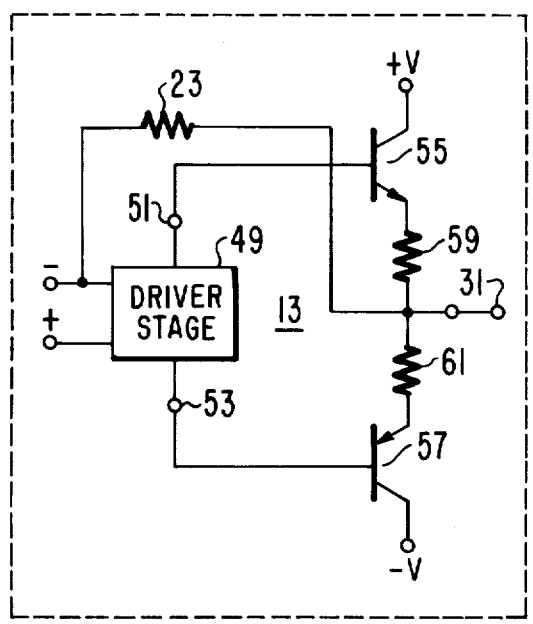

In the drawing:

FIG. 1 is a block and schematic diagram of a typical audio amplifier embodying the invention; and FIG. 2 is a block and schematic diagram of the output stage of FIG. 1.

In FIG. 1, the amplifier includes a pair of differential amplifiers 11 and 13, serving as a preamplifier and output stage, respectively. Amplifier 11 has an output terminal connected via the feedback resistor 15 to its inverting input terminal, an input resistor 17 connected from the inverting input terminal to the signal input terminal 19, and its noninverting input terminal connected via a resistor 21 to ground. Amplifier 13 has an output terminal connected via a feedback resistor 23 to its inverting input terminal, noninverting input terminal connected via a resistor 25 to ground, and also has its inverting input terminal connected via input resistor 27 to the output terminal of amplifier 11, and its output terminal connected via a feedback resistor 29 to noninverting input terminal 11. Loudspeaker 33 is connected between the signal output terminal 31 and a ground terminal 35. It should be noted that the amplifier shown is for purposes of illustration only, and any amplifier including at least one feedback element for controlling the gain of the amplifier could be substituted.

The transient and thermal protection circuit 37 includes a temperature sensitive switch (TSS) 39 heat coupled (indicated by the wavy lines 38) to the output transistors 55, 57 (see FIG. 2) of the output stage of amplifier 13, a zener diode 41 and a relay 43. The normally-closed contacts of the temperature sensitive switch 39 are connected between an operating voltage terminal 45 and the cathode of zener diode 41. The same supply produces this voltage $+V$ as produces the voltages $+V$ and $-V$ which serve as the operating voltages for stages 11 and 13. The anode of the diode 41 is connected to one end of the coil 46 of the relay 43, the other end of which is connected to ground. A pair of normally-closed contacts 47 of the relay 43 is connected across feedback resistor 23, in the preferred embodiment.

In FIG. 2, the output stage 13 of the amplifier may include a driver stage 49 having inverting ($-$) and noninverting ($+$) input terminals, and a pair of output terminals 51, 53 connected individually to the base electrodes of NPN and PNP output transistors 55 and 57, respectively. The collector electrodes of transistors 55 and 57 are connected to positive and negative voltage supplies, respectively. These output transistors 55, 57 also have emitter electrodes coupled via resistors 59 and 61, respectively, to output terminal 31.

In operation, the gain of the preamplifier 11 is determined by the ratio of the resistance of resistor 15 to that of resistor 17; the gain of the output stage is determined by the ratio of the impedance in its local feedback connection to the resistance of resistor 27 — that is, during normal operation the resistance of resistor 23 to the resistance of resistor 27; and the overall gain of the amplifier is determined by the ratio of the resistance of resistor 29 to that of resistor 21. Assume that a signal is applied between input signal terminal 19 and ground. When power is initially applied to the amplifier, the operating voltage $+V$ is simultaneously applied to the amplifier and to terminal 45 of the transient and thermal protection circuit 37, via a power switch or other means (not shown). The breakdown voltage level of zener diode 41 is chosen to insure that the relay 43 will not operate until the operating voltage $+V$ has risen to a predetermined percentage of its nominal operating level, at which level the turn-on transients of the amplifier have substantially subsided. In practice, it has been found that a combination of a relay 43 and a zener diode 41, which would turn on the amplifier at about 70% of the nominal operating voltage level $+V$, insures substantial elimination of the transients in the output signal.

During the initial turn-on period, that is, the period in which the voltage $+V$ is rising from 0 volts to 70% of its design value, the normally-closed contacts 47 of relay 43 provide a low resistance across feedback as compared to the resistance of resistor 27 resistor 23. This reduces the gain of the output stage amplifier 13 to substantially zero. It is during this period, that is, the period in which $+V$ is rapidly increasing, that the undesirable transients would normally be generated. Thus in the present circuit such transients are never permitted to develop (because the amplifier is, in effect, inoperative) and no or substantially no turn-on thump develops in the speaker. Note that this is different in a fundamental way from the previous approach described above where the amplifier does produce a turn-on transient but where, by disconnecting the speaker, the transient is prevented from causing the speaker to produce a thump.

When the voltage +V reaches a level such that the breakdown voltage of zener diode 41 is exceeded, the diode conducts and relay 43 is activated. This causes its contacts 47 to open and the output stage amplifier 13 resumes normal operation. Similarly, when power is removed from the amplifier, the zener diode 41 stops conducting when the operating voltage +V falls to below the breakdown level of the diode 41, turning off relay 43, causing the contacts 47 to again close, reducing the gain of the output stage 13 to substantially zero. In turn, the output signal at terminal 31 is likewise substantially reduced to zero, substantially preventing any turn-off transient from developing at output terminal 31. The protection circuit 37 also provides thermal protection for the amplifier. When the temperature of transistors 55, 57 of output stage 13 exceed a given value, the normally-closed contacts of the TSS 39 open, turning off relay 43. This causes the contacts 47 of relay 43 to close, reducing the gain of the output stage 13 to substantially zero. The transistors of stage 13 now cool and when they reach a safe operating temperature, the contacts of TSS 39 again close, causing relay 43 to turn-on (assume the operating voltage +V is at a level greater than the voltage required to turn on relay 43 and the zener diode 41). This places the amplifier stage 13 back in operation as already described.

It should be noted that the relay contacts 47 of the protection circuit 37 could have been placed across either one of feedback resistors 15 or 29 to provide the transient and thermal protection. However, the placement shown is a preferred one in that it provides somewhat faster and more complete turn-off of the output transistors 55, 57 than these other placements.

The use of the protection circuit 37 is not limited to audio amplifiers. It is equally applicable to other forms of amplifiers which include a feedback element for controlling the gain of the amplifier.

An advantage of protection circuits of the present application is that it can be used for both high and low power amplifiers as contacts 47 switch only milliamperes of current and contacts 39 also need switch only small amounts of current. Another is that since the operating voltage +V applied to the amplifier normally reaches its nominal operating value in fractions of a second, the turn-on delay is not significant — is not noticeable.

What is claimed is:

1. A circuit for reducing the transients normally produced in an amplifier, when the operating voltage of the amplifier rapidly changes, said amplifier including input and output terminals with a degenerative feedback connection between them which includes impedance means, the voltage gain of said amplifier being defined by the impedance of said impedance means divided by the source impedance of a means supplying input signal to said input terminal, said circuit comprising:
    means responsive to said operating voltage for placing a path of substantially lower impedance than said source impedance across said impedance means, whenever said operating voltage is lower than a given value.

2. A circuit as set forth in claim 1 further including:
    means responsive to the temperature of said amplifier for placing a path of substantially lower impedance than the impedance of said impedance means, across said impedance means, when said temperature exceeds a given value.

3. A method for thermally protecting an amplifier, and for reducing the transients normally produced in the amplifier when the operating voltage of the amplifier rapidly changes, said amplifier including an output stage, and a feedback connection which includes impedance means whose value of impedance affects the gain of said amplifier, comprising the steps of:
    sensing the amplitude of said operating voltage;
    sensing the temperature of at least the output stage of said amplifier; and
    reducing substantially the effective value of the impedance in said feedback connection whenever either said operating voltage is lower than a given value or said temperature is greater than a given value.

4. A circuit for reducing the transients normally produced in an amplifier, when the operating voltage of the amplifier rapidly changes, said amplifier including a feedback connection which includes impedance means, whose value of impedance affects the gain of said amplifier, and a pair of terminals across which the operating voltage may be applied, comprising:
    means coupled between said terminals for sensing the amplitude of the operating voltage; and
    means responsive to said sensing means for connecting a relatively low resistance across said impedance means, whenever said sensed amplitude is lower than a predetermined percentage of the nominal amplitude of said operating voltage.

5. The circuit of claim 4, wherein said sensing means includes:
    a zener diode having first and second electrodes coupled between said pair of terminals, respectively, and being conductive above said predetermined amplitude of operating voltage.

6. The circuit of claim 5, wherein said low resistance means includes:
    a relay including an operating coil connected between one of said pair of terminals and said second electrode of said zener diode, and a pair of normally-closed contacts connected across said impedance means.

7. The circuit of claim 6, wherein said amplifier further includes a transistorized output stage, and said circuit further includes:
    means coupled between said terminals for operating said responsive means to connect said relatively low resistance across said feedback element, whenever the temperature of said output stage attains or exceeds a predetermined level, for protecting said output stage against thermal overload.

8. The circuit of claim 7, wherein said operating means includes:
    a normally closed temperature sensitive switch heat coupled to and at substantially the same ambient temperature as said output stage, said switch having a pair of normally-closed contacts connected between said first electrode of said zener diode and the other one of said pair of terminals.

9. A circuit for providing thermal overload protection for the transistors in the output stage of an amplifier, and for substantially reducing transients in the amplifier when the operating voltage of the amplifier changes rapidly, said amplifier including a feedback element coupled between two different signal terminals, for controlling the gain of said amplifier, and a pair of terminals across which an operating voltage may be applied, comprising:

means coupled between said terminals for sensing the amplitude of an operating voltage applied across said pair of terminals;

means heat coupled to and at the same ambient temperature as said output stage for sensing the temperature of the transistors thereof; and means responsive to said temperature and amplitude sensing means for connecting a relatively low resistance across said feedback element, whenever the sensed temperature exceeds a predetermined temperature, or the sensed amplitude is lower than a predetermined percentage of the nominal amplitude of said operating voltage.

10. The circuit of claim 9, wherein said amplitude sensing means includes:

a zener diode having first and second electrodes coupled between said terminals, said zener diode being conductive above said predetermined amplitude of operating voltage.

11. The circuit of claim 10, wherein said temperature sensing means includes:

a temperature sensitive switch having a pair of normally closed contacts coupled in series with said zener diode between said terminals, said contacts opening at said predetermined temperature of said output transistors.

12. The circuit of claim 11, wherein said low resistance means includes:

a relay including an operating coil connected in series with said zener diode and normally-closed contacts of said temperature sensitive switch between said pair of terminals, and a pair of normally-closed contacts connected across said feedback element.

13. In combination:

an amplifier having a noninverting input terminal coupled to a point of reference potential, an inverting input terminal to which a signal may be applied, an output terminal, and a feedback resistance connected between said output and inverting input terminals for controlling the gain of said amplifier;

a relay comprising a coil and normally-closed contacts controlled by said coil connected across said feedback resistance;

a pair of terminals across which an operating voltage for said relay and said amplifier may be applied; and a series circuit connected between said terminals comprising said coil, a normally-open voltage responsive switch which conducts only when the voltage across it exceeds a given value, and a normally-closed, temperature sensitive switch which is heat coupled to said amplifier and which opens when the temperature of said amplifier exceeds a given value.

14. In the combination as set forth in claim 13, said voltage responsive switch comprising a zener diode.

15. In a circuit which includes an audio amplifier, a loudspeaker driven by said amplifier, a feedback element coupled between an output and an input terminal of said amplifier for controlling the gain of said amplifier, and a pair of operating voltage terminals coupled to said amplifier, a circuit for substantially reducing the noise thumps emitted from said loudspeaker, due to voltage transients occurring in the output signal of the amplifier, when an operating voltage is initially applied across or removed from said pair of operating voltage terminals, comprising:

a zener diode coupled between said operating voltage terminals, said diode being poled to be rendered conductive only when said operating voltage exceeds a given level; and a relay including an operating coil and a pair of normally closed contacts, said coil being connected in series with said zener diode, and said contacts being connected across said feedback element, said relay operating to open said contacts, in response to conduction of said zener diode, thereby increasing the gain of said amplifier from a substantially low value to a value set by said feedback element.

16. The audio amplifier of claim 15 further including a transistorized output stage, and said circuit further including:

a temperature sensitive switch heat coupled to and at substantially the same ambient temperature as said output stage, said switch having a pair of normally-closed contacts connected in series with said zener diode and the operating coil of said relay, for opening said series circuit to render said relay inoperative, whenever the temperature of said output stage exceeds a predetermined value, for causing said contacts of said relay to substantially short-circuit said feedback element, thereby substantially reducing the gain of said output stage to protect the transistors thereof.

* * * * *